United States Patent
Bae et al.

(10) Patent No.: US 12,198,011 B2
(45) Date of Patent: Jan. 14, 2025

(54) QUANTUM COMPUTING DEVICE AND METHOD OF MITIGATING DETECTION CROSSTALK

(71) Applicant: KOREA ADVANCED INSTITUTE OF SCIENCE AND TECHNOLOGY, Daejeon (KR)

(72) Inventors: Joonwoo Bae, Daejeon (KR); Seungchan Seo, Daejeon (KR)

(73) Assignee: KOREA ADVANCED INSTITUTE OF SCIENCE AND TECHNOLOGY, Daejeon (KR)

(*) Notice: Subject to any disclaimer, the term of this patent is extended or adjusted under 35 U.S.C. 154(b) by 272 days.

(21) Appl. No.: 17/725,726

(22) Filed: Apr. 21, 2022

(65) Prior Publication Data
US 2022/0414515 A1   Dec. 29, 2022

(30) Foreign Application Priority Data
Jun. 25, 2021 (KR) .................. 10-2021-0083317

(51) Int. Cl.
G06N 10/40 (2022.01)
B82Y 10/00 (2011.01)
G06N 10/20 (2022.01)
G06N 10/60 (2022.01)
G06N 10/70 (2022.01)
H03K 17/92 (2006.01)

(52) U.S. Cl.
CPC .............. G06N 10/40 (2022.01); B82Y 10/00 (2013.01); G06N 10/20 (2022.01); G06N 10/60 (2022.01); G06N 10/70 (2022.01); H03K 17/92 (2013.01)

(58) Field of Classification Search
CPC ........ G06N 10/40; G06N 10/60; G06N 10/70; G06N 10/20; H03K 17/92; B82Y 10/00
USPC .......................... 327/31; 326/1; 716/100, 136
See application file for complete search history.

(56) References Cited

U.S. PATENT DOCUMENTS

| | | | |
|---|---|---|---|
| 7,277,872 B2 | 10/2007 | Raussendorf et al. | |
| 9,208,280 B2 | 12/2015 | Bocharov et al. | |
| 2018/0225586 A1* | 8/2018 | Chow ................ | H03K 19/1958 |
| 2020/0387822 A1* | 12/2020 | Kilmov ................. | G06N 10/00 |

FOREIGN PATENT DOCUMENTS

| | | |
|---|---|---|
| CN | 113011593 | 6/2021 |
| JP | 2017-191309 | 10/2017 |
| JP | 2020-513610 | 5/2020 |
| KR | 10-2020-0104374 | 9/2020 |

OTHER PUBLICATIONS

Mohan Sarovar et al., "Detecting crosstalk errors in quantum information processors", Quantum 4, 321 (2020).

(Continued)

*Primary Examiner* — Arnold M Kinkead
(74) *Attorney, Agent, or Firm* — LEX IP MEISTER, PLLC

(57) ABSTRACT

A quantum computing device performs quantum pre-processing on a plurality of qubits, performs measurements on the plurality of qubits on which the quantum pre-processing is performed, and performing classical post-processing on a measurement outcome of the plurality of qubits to mitigate a detection crosstalk included in the measurement outcome.

19 Claims, 4 Drawing Sheets

(56) References Cited

OTHER PUBLICATIONS

Yanzhu Chen et al., "Detector tomography on IBM quantum computers and mitigation of an imperfect measurement", Phys. Rev. A 100, 052315 (2019), DOI: 10.1103/PhysRevA.100.052315.
Seungchan Seo et al., "Mitigation of Crosstalk Errors in a Quantum Measurement and Its Applications", ArXiv:2112.10651v1 (2021), Dec. 20, 2021.
Hyeokjea Kwon et al., "A hybrid quantum-classical approach to mitigating measurement errors", arXiv:2003.12314v1 [quant-ph] Mar. 27, 2020. H. Kwon and J. Bae are with the School of Electrical Engineering, Korea Advanced Institute of Science and Technology, Daejeon, Republic of (South) Korea.

* cited by examiner

QUANTUM COMPUTING DEVICE AND METHOD OF MITIGATING DETECTION CROSSTALK

CROSS-REFERENCE TO RELATED APPLICATION

This application claims priority to and the benefit of Korean Patent Application No. 10-2021-0083317 filed in the Korean Intellectual Property Office on Jun. 25, 2021, the entire contents of which are incorporated herein by reference.

BACKGROUND

(a) Field

The present disclosure relates to a quantum computing device and a method of mitigating a detection crosstalk.

(b) Description of the Related Art

Quantum computing performs quantum algorithms or general quantum information processing and involves a measurement process to read outcomes. When the quantum computing attempts to measure several qubits independently, independent measurements may not be performed due to interactions among measurement devices. In particular, the current quantum technology contains a lot of noise, so independent measurements may not be performed. This is called a detection crosstalk.

SUMMARY

Some embodiments may provide a quantum computing device and a method of mitigating a detecting crosstalk, capable of mitigating the detection crosstalk.

According to an embodiment, a quantum computing device including a quantum device including a qubit system, a detector, and a mitigation module may be provided. The detector may perform measurements on a plurality of qubits of the qubit system. The mitigation module may perform quantum pre-processing on the plurality of qubits before performing the measurements on the plurality of qubits in the detector, and perform classical post-processing on a measurement outcome of the plurality of qubits in the detector to mitigate a detection crosstalk included in the measurement outcome.

In some embodiments, the mitigation module may perform the quantum pre-processing by applying a single-qubit gate to each of the plurality of qubits.

In some embodiments, the single-qubit gate may represent a local unitary.

In some embodiments, the mitigation module may perform the classical post-processing through analysis of a quantum measurement operator describing the detector.

In some embodiments, the mitigation module may perform the quantum pre-processing and the classical post-processing, by performing decomposition on a quantum measurement operator describing the detector based on a parameter and an operator to optimize the parameter and the operator.

In some embodiments, the mitigation module may normalize the quantum measurement operator, and decompose the normalized quantum measurement operator as a following equation: $(1-\epsilon) V_{\vec{a}} |\vec{a}\rangle\langle\vec{a}| V_{\vec{a}}^{\dagger} + \epsilon P$. Here, the $\epsilon$ denotes the parameter, the $V_{\vec{a}}$ denotes a transformation of the quantum pre-processing, the $\vec{a}$ denotes the measurement outcome of the plurality of qubits, and the P denotes the operator that is determined by the $\epsilon$ and the $V_{\vec{a}}$.

In some embodiments, the operator may be an operator of unit trace.

In some embodiments, the mitigation module may mitigate the detection crosstalk included in the measurement outcome based on the parameter and the operator.

In some embodiments, the mitigation module may mitigate the detection crosstalk included in the measurement outcome as in a following equation:

$$\frac{1}{1-\epsilon}\left((tr\Pi_{\vec{a}})^{-1} p_e(\vec{a}) - \epsilon\eta\right).$$

Here, the $\epsilon$ denotes the parameter, the $\eta$ denotes a constant determined by the operator, the $\vec{a}$ denotes the measurement outcome of the plurality of qubits, the $\Pi_{\vec{a}}$ denotes an operator describing a quantum measurement of the detector, the tr denotes a trace function, and $p_e(\vec{a})$ denotes a probability of obtaining the $\vec{a}$.

In some embodiments, the mitigation module may minimize an upper bound of an error between a measurement outcome without the detection crosstalk and an outcome obtained by approximating the measurement outcome without the detection crosstalk on an assumption that an expected value of a Hermitian operator in the decomposition is a constant. In this case, the Hermitian operator may be defined by a local unitary of the quantum pre-processing and the operator P in the decomposition.

In some embodiments, the mitigation module may optimize the parameter and operator P to minimize the upper bound of the error.

In some embodiments, the upper bound of the error may be defined based on the parameter, a maximum eigenvalue of the operator, and a minimum eigenvalue of the operator.

In some embodiments, the mitigation module may optimize the parameter and the operator P while constraining the operator to a predetermined condition.

In some embodiments, the predetermined condition may be a condition in which the operator is equal to or greater than zero.

According to another embodiment, a quantum computing device including a quantum device including a qubit system, a detector, a plurality of single-qubit gates, and a mitigation module may be provided. The detector may perform measurements on a plurality of qubits of the qubit system. The plurality of single-qubit gates may be positioned in front of the detector, and may be applied to the plurality of qubits, respectively. The mitigation module may perform classical post-processing on a measurement outcome of the plurality of qubits.

In some embodiments, the mitigation module may mitigate a detection crosstalk included in the measurement outcome by performing the classical post-processing.

In some embodiments, the mitigation module may decompose a quantum measurement operator describing the detector based on a parameter and an operator, and optimize the parameter and the operator to mitigate the detection crosstalk.

According to yet another embodiment, a method of mitigating a detection crosstalk in a quantum computing device may be provided. The method may include performing quantum pre-processing on a plurality of qubits, performing measurements on the plurality of qubits on which the quantum pre-processing is performed, and performing classical post-processing on a measurement outcome of the plurality of qubits to mitigate a detection crosstalk included in the measurement outcome.

In some embodiments, performing the quantum pre-processing may include applying a single-qubit gate to each of the plurality of qubits.

In some embodiments, performing the classical post-processing may include decomposing, based on a parameter and an operator, a quantum measurement operator describing a detector that perform the measurements, and optimizing the parameter and the operator to mitigate the detection crosstalk.

DETAILED DESCRIPTION OF THE EMBODIMENTS

Figure 1:
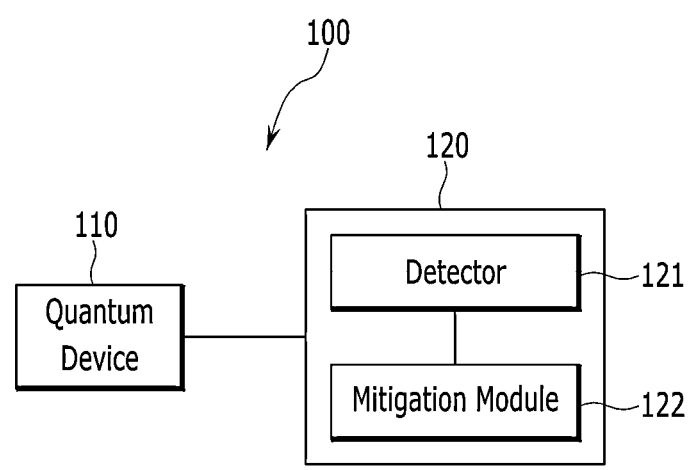
FIG. 1 is a block diagram showing an example of a quantum computing device according to an embodiment.

In the following detailed description, only certain example embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

As used herein, the singular forms "a" and "an" are intended to include the plural forms as well, unless the context clearly indicates otherwise.

The sequence of operations or steps is not limited to the order presented in the claims or figures unless specifically indicated otherwise. The order of operations or steps may be changed, several operations or steps may be merged, a certain operation or step may be divided, and a specific operation or step may not be performed.

FIG. 1 is a block diagram showing an example of a quantum computing device according to an embodiment.

Referring to FIG. 1, the quantum computing apparatus 100 includes a quantum device 110 and a measurement device 120. In some embodiments, the quantum computing device 100 may further include a storage device (not shown) that stores measurement outcomes.

The quantum device 110 may be a device that includes a physical quantum system (e.g., a qubit system) which is used to perform quantum computations or simulations.

The measurement device 120 may communicate with the quantum device 110, and may include a detector 121 that performs measurements on the physical quantum system included in the quantum device 110. For example, the detector 121 may measure each of qubits included in the quantum device 110. In some embodiments, an operator describing the detector 121 may be defined by using quantum detector tomography (QDT). In some embodiments, the detector 121 may include a quantum circuit for measurement of a quantum state. In some embodiments, the detector 121 may be provided for each qubit to be measured.

The measurement device 120 may further include a mitigation module 122 that mitigates a detection crosstalk included in a measurement outcome of the detector 121. In some embodiments, the detector 121 may store the measurement outcome in the storage device, and the mitigation module 122 may retrieve the measurement outcome from the storage device. In some embodiments, the detector 121 may provide the measurement outcome to the mitigation module 122 directly. In some embodiments, the mitigation module 122 may be implemented as a physical processor.

Next, a detection crosstalk in a quantum computing device is described.

In quantum computing, a measurement process for reading out a quantum state, i.e., a measurement outcome, is performed independently for a plurality of qubits. If interactions among detectors exist, the independent measurement may be not performed. An error caused by noise among the detectors when obtaining the measurement outcome by measuring the plurality of qubits is called "detection crosstalk".

The existence of the detection crosstalk may be investigated after obtaining an operator describing the quantum measurement (positive operator value measurement, POVM), for example, through quantum detector tomography. The POVM for the n-qubit measurements $\vec{a}=a_1 a_2 \ldots a_n$, may be described as in Equation 1. Here, $a_i$ is a measurement outcome of qubit $q_i$ ($i=1, \ldots, n$).

$$\Pi_{\vec{a}} = \Pi_{a_1} \otimes \ldots \otimes \Pi_{a_n} \qquad \text{Equation 1}$$

In Equation 1, $\Pi_{a_i}$ denotes an POVM element of an individual qubit $q_i$.

When the POVM for the measurement outcome of n qubits cannot be expressed as in Equation 1 (that is, when the POVM for the measurement outcomes of n qubits cannot be factorized in a product of the POVM elements of individual qubits as in Equation 2), it may be said that detection crosstalk exists.

$$\Pi_{\vec{a}} \neq \Pi_{a_1} \otimes \ldots \otimes \Pi_{a_n} \qquad \text{Equation 2}$$

When the POVM obtained through the quantum detector tomography is normalized to $\tilde{\Pi}_{\vec{a}}$, the normalized POVM may be expressed as in Equation 3.

$$\tilde{\Pi}_{\vec{a}} := \frac{\Pi_{\vec{a}}}{tr[\Pi_{\vec{a}}]} \qquad \text{Equation 3}$$

In Equation 3, tr[ ] denotes a trace function.

When an optimization process as expressed in Equation 4 is considered, the existence of the detection crosstalk and a value of $D_C$ being a positive number in Equation 4 are equivalent. That is, the existence of detection crosstalk may be determined through the value of $D_C$.

$$D_C = \min_{\Pi_{\vec{a}} \geq 0} \left\| \tilde{\Pi}_{\vec{a}} - \Pi_{\vec{a}} \right\|_1 \qquad \text{Equation 4}$$

Next, the quantum detector tomography is described.

Figure 2:
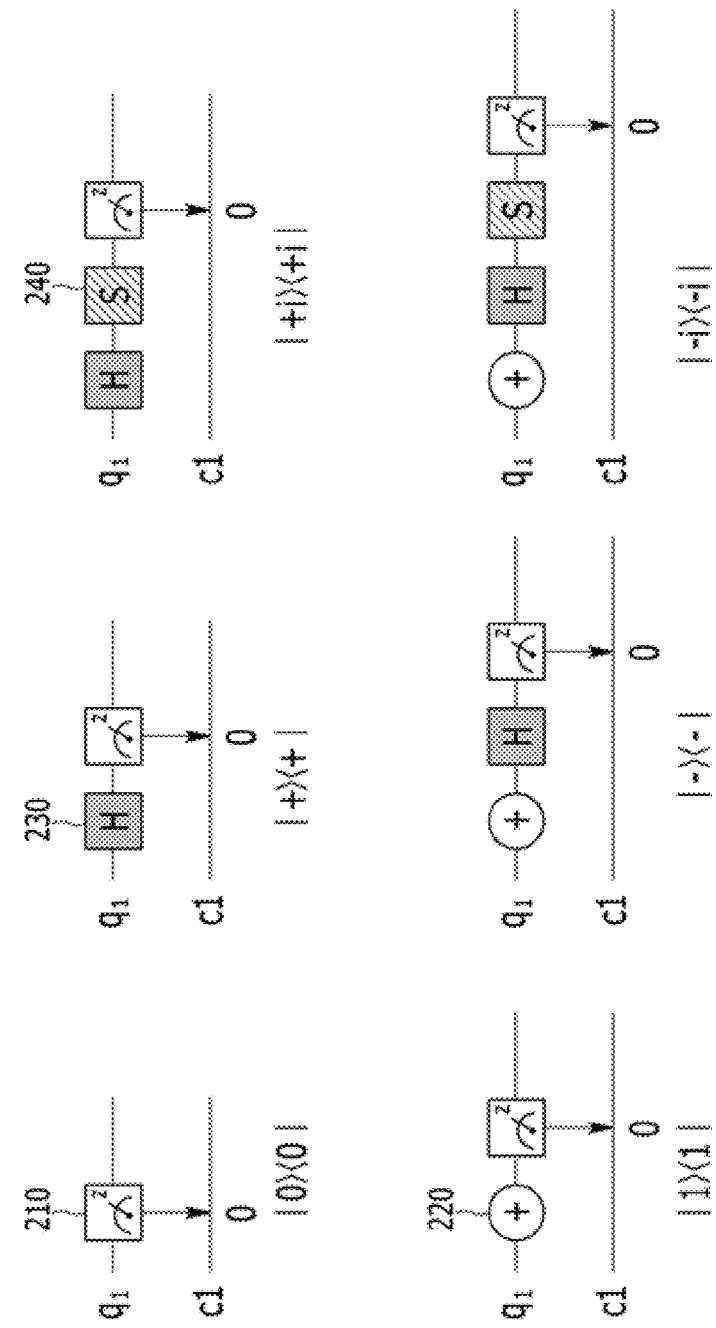
FIG. 2 is a diagram showing an example of a quantum circuit of a quantum computing device according to an embodiment.

The quantum detector tomography is a method of investigating an operator that describes measurements of a quantum device. In some embodiments, a quantum detector tomography method using a maximum likelihood estimation (MLE) technique may be used. Referring to FIG. 2, a detector may measure each qubit $q_i$ in mutually unbiased bases (MUB), as shown in Equation 5, using a quantum circuit.

$$\{|0\rangle\langle 0|, |1\rangle\langle 1|, |+\rangle\langle +|, |-\rangle\langle -|, |+i\rangle\langle +i|, |-i\rangle\langle -i|\} \quad \text{Equation 5}$$

As shown in FIG. 2, the measurement of the quantum circuit may be performed as a Z-measurement 210, and the quantum circuit may include various quantum gates 220, 230, and 240. The various quantum gates may include, for example, a Hadamard gate 220, a phase shift gate (S) 230, and a NOT gate (or Pauli X gate) 240. The qubit $q_0$ input to the quantum circuit may be measured as shown in FIG. 2 after not passing through the quantum gate or after passing through a combination of quantum gates.

A measurement outcome of the detector is given as a probability. The measurement is performed by using the Z-measurement, i.e., $|0\rangle\langle 0|$, $|1\rangle\langle 1|$, and outputs when detected by measurement operators are 0 and 1, respectively. The probability that an arbitrary quantum state $\rho$ of a qubit $q_i$ is detected by a detector described by the measurement operator $\Pi_{a_i}$ is $p_{p,i} = tr(\rho \Pi_{a_i})$. The detector may obtain an unknown set of measurement operators $\{\tilde{\Pi}_{\vec{a}}\}$ using the MUB by a following method, for example, by a method expressed in Equations 6 to 10.

First, the measurement device may measure the MUB to obtain a probability $f_{n,i}$ that the n-th state $\rho_n$ is detected by the i-th detector, and calculate a log-likelihood function as expressed in Equation 6 based on the probability $f_{n,i}$.

$$\log \mathcal{L} = \sum_n \sum_i f_{n,j} \log tr\left(\rho_n \prod_{a_i}\right) \quad \text{Equation 6}$$

In Equation 6, $\tilde{\Pi}_{a_i}$ denotes a POVM element into which $\Pi_{a_i}$ is normalized according to Equation 3.

Next, the measurement device finds a maximum value of the log-likelihood function expressed in Equation 6 that satisfies a condition of Equation 7. In this case, an optimization equation that finds the maximum value of the log-likelihood function of Equation 6 satisfying the condition of Equation 7 using a Lagrange multiplier method may be expressed as in Equation 8. In Equation 8, a Lagrange multiplier $R_i$ may be given as in Equation 9.

$$\sum_i \tilde{\Pi}_{a_i} = I \quad \text{Equation 7}$$

In Equation 7, I denotes an identity matrix.

$$\tilde{\Pi}_{a_i}^{t+1} = R_i \tilde{\Pi}_{a_i}^t R_i^\dagger \quad \text{Equation 8}$$

In Equation 8, $R_i^\dagger$ is a conjugate transpose of $R_i$.

$$R_i = \sum_n \frac{f_{n,i}}{p_{n,i}} \left( \sum_j \sum_{l,m} \frac{f_{j,l} f_{j,m}}{p_{j,l} p_{j,m}} \rho_l \prod_{a_j} \rho_m \right)^{-\frac{1}{2}} \rho_n \quad \text{Equation 9}$$

While repeating the calculation expressed in Equation 8, the measurement device ends the optimization when a difference between $\tilde{\Pi}_{a_i}^t$ and $\tilde{\Pi}_{a_i}^{t+1}$ obtained in the t-th iteration is smaller than a threshold, that is, when the condition expressed in Equation 10 is satisfied. Further, the measurement device outputs $\{\tilde{\Pi}_{\vec{a}_i}\}$ in the i-th iteration as a result of quantum detector tomography. In some embodiments, the threshold $\gamma$ in Equation 10 may be set such that a numerical error according to the optimization process is smaller than an uncertainty caused by a statistical error.

$$\sum_i \left\| \tilde{\Pi}_{a_i}^t - \tilde{\Pi}_{a_i}^{t+1} \right\|_1 < \gamma \quad \text{Equation 10}$$

Next, a method of mitigating a detection crosstalk according to an embodiment is described.

Figure 3:
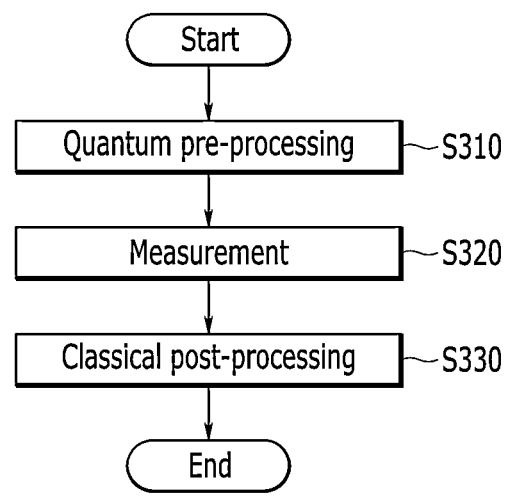
FIG. 3 is a flowchart showing an example of a method of mitigating a detection crosstalk according to an embodiment.
Figure 4:
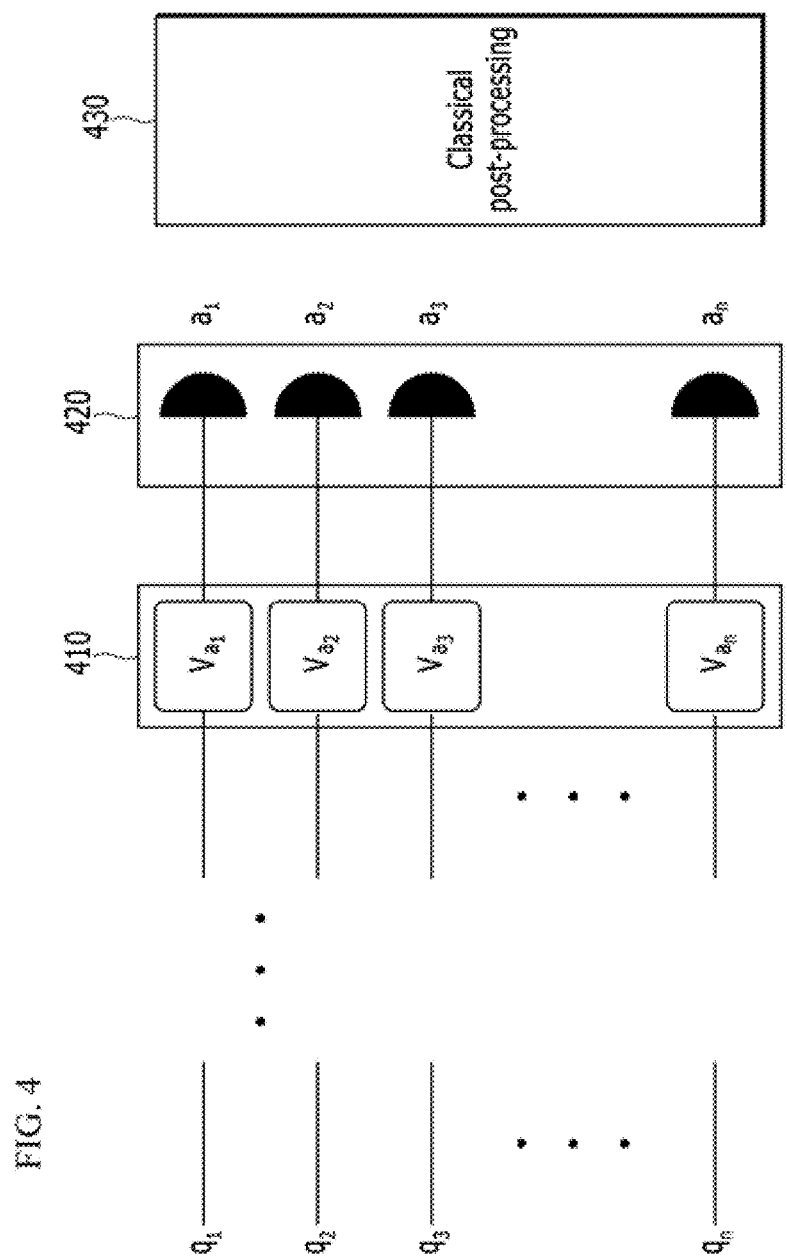
FIG. 4 is an example of a single-qubit gate applied to quantum pre-processing according to an embodiment.

FIG. 3 is a flowchart showing an example of a method of mitigating a detection crosstalk according to an embodiment, and FIG. 4 is an example of a single-qubit gate applied to quantum pre-processing according to an embodiment.

A measurement device obtains a quantum measurement operator describing a quantum detector through quantum detector tomography and analyzes the quantum measurement operator to perform mitigation of a detection crosstalk. Referring to FIG. 3, the measurement device, for example, a mitigation module of the measurement device, performs quantum pre-processing at S310. Next, the measuring device, for example, a detector of the measuring device, performs measuring processing of measuring qubits at S320. Next, the measurement device, for example, the mitigation module of the measurement device, performs classical post-processing through analysis of the quantum measurement operator at S330. The quantum pre-processing S310 is a process of applying a single-qubit gate to an individual qubit before measurements, and the classical post-processing S330 is a process of adjusting a probability obtained after the measurements.

In some embodiments, the mitigation module of the measurement device may decompose the quantum measurement operator of the detector to analyze the quantum measurement operator. The mitigation module may decompose the quantum measurement operator, for example, as in Equation 11, based on a parameter $\epsilon$ and an operator P. The decomposition may vary depending on the choice of the parameter $\epsilon$ and operator P. In some embodiments, the mitigation module may perform the classical post-processing by optimizing the parameter $\epsilon$ and the operator P. In some embodiments, the operator P may be an operator of unit trace.

$$\tilde{\Pi}_{\vec{a}} := \frac{\Pi_{\vec{a}}}{tr[\Pi_{\vec{a}}]} = (1-\epsilon) V_{\vec{a}} |\vec{a}\rangle\langle\vec{a}| V_{\vec{a}}^\dagger + \epsilon P \quad \text{Equation 11}$$

In Equation 11, $V_{\vec{a}}$ is a local unitary transformation and represents a plurality of gates respectively acting on a plurality of qubits. That is, $V_{\vec{a}} = V_{a_1} \otimes \ldots \otimes V_{a_n}$ where $V_{a_j}$ is a single-qubit gate applied to an individual qubit $q_j$ and represents a local unitary. Further, the operator $|\vec{a}\rangle$ $\langle\vec{a}| := |a_1\rangle\langle a_1| \otimes \ldots \otimes |a_n\rangle\langle a_n|$ describes measurements in an ideal case in which there is no crosstalk.

In Equation 11, $V_{\vec{a}}$ may be obtained through an optimization process of Equation 12.

$$V_{\vec{a}} := \bigotimes_k V_{a_k} \quad \min \quad \left\| \tilde{\Pi}_{\vec{a}} - V_{\vec{a}} |\vec{a}\rangle\langle\vec{a}| V_{\vec{a}}^\dagger \right\|_1 \quad \text{Equation 12}$$

The quantum pre-processing uses $V_{\vec{a}}$ obtained in Equation 12. In some embodiments, $V_{\vec{a}}$ may be obtained in advance by using the optimization process of Equation 12 through repeated experiments, and $V_{\vec{a}}$ obtained in advance may be used in the quantum pre-processing.

In some embodiments, as shown in FIG. 4, the measurement device applies a single-qubit gate 410, i.e. a unitary operator $V_{a_j}$, to each qubit $q_j$ in front of a detector 420 as the quantum pre-processing. The measurement device may perform the classical post-processing 430 on measurement outcomes which the detector 420 obtains by measuring the qubits $q_j$ to which the quantum pre-processing is applied.

Equation 13 may be derived by applying $V_{\vec{a}}$ to both sides of Equation 11.

$$\tilde{\Pi}_{\vec{a}} \mapsto V_{\vec{a}}^\dagger \tilde{\Pi}_{\vec{a}} V_{\vec{a}} = (1-\epsilon)|\vec{a}\rangle\langle\vec{a}| + \epsilon V_{\vec{a}}^\dagger P V_{\vec{a}} \qquad \text{Equation 13}$$

In some embodiments, $\epsilon$ in Equation 13 may be a minimum $\epsilon$ that satisfies a predetermined constraint, for example, $P \geq 0$. Here, $P \geq 0$ means that all eigenvalues of P are greater than zero.

Next, the measurement device performs the classical post-processing through analysis of the measurement operator. A probability that the measurement device obtains an outcome $\vec{a}$ by measuring an arbitrary state $\rho$ through measurements described in Equation 13 (i.e., measurements on n-qubit state) may be given as in Equation 14. In the decomposition of Equation 11, if an expected value of a Hermitian operator $V_{\vec{a}}^\dagger P V_{\vec{a}}$, defined by the local unitary $V_{\vec{a}}$ and the operator P is expressed as $q(\vec{a}) = tr[V_{\vec{a}}^\dagger P V_{\vec{a}}]$, Equation 14 may be expressed as Equation 15.

$$p_e(\vec{a}) = tr[\rho V_{\vec{a}}^\dagger \tilde{\Pi}_{\vec{a}} V_{\vec{a}}] \qquad \text{Equation 14}$$

$$(tr[\tilde{\Pi}_{\vec{a}}])^{-1} p_e(\vec{a}) = (1-\epsilon) p_0(\vec{a}) + \epsilon q(\vec{a}) \qquad \text{Equation 15}$$

In Equation 15, $p_0(\vec{a}) = tr[\rho |\vec{a}\rangle\langle\vec{a}|]$ is a noise-free measurement outcome wherein the noise may be, for example, a detection crosstalk.

Since a value of the probability distribution $q(\vec{a})$ is not known for an arbitrary state $\rho$, in some embodiments, for convenience, $q(\vec{a})$ may be assumed to be a constant $\eta \in [0, 1]$. When rewriting Equations 14 and 15 using the constant $\eta$, $p_0(\vec{a})$ may be derived as in Equation 16. That is, in the decomposition of Equation 15, the noise-free measurement outcome approximated on the assumption that the expected value of the Hermitian operator is the constant may be given as in Equation 16.

$$p_0(\vec{a}) \mapsto p_0^{(\eta)}(\vec{a}) = \frac{1}{1-\epsilon}\left(\left(tr\prod_{\vec{a}}\right)^{-1} p_e(\vec{a}) - \epsilon\,\eta\right) \qquad \text{Equation 16}$$

The measurement device performs a restoration process of Equation 16 by choosing $\eta$ for the probability distribution $p_e(\vec{a})$ of the measurement outcome obtained from the actual measurement. Equation 16 includes an error according to the choice of $\eta$, and a degree of error according to $\eta$ may be calculated as in Equation 17.

$$err(\epsilon, \eta) := |p_0(\vec{a}) - p_0^{(\eta)}(\vec{a})| = \frac{\epsilon|q(\vec{a}) - \eta|}{1-\epsilon} \qquad \text{Equation 17}$$

This error depends on the parameter $\epsilon$ and the choice of the constant $\eta$, both of which are of order $10^{-1}$. Thus, the error may be $O(\epsilon |q(\vec{a}) - \eta|)$ which is found in a percent level. Here, $O(\,)$ denotes a big O function.

The error of Equation 17 depends on a difference between a maximum eigenvalue and a minimum eigenvalue of the operator P. In some embodiments, the value of $\eta$ may be chosen as in Equation 18.

$$\eta := q_c = \tfrac{1}{2}(b_+(P) + b_-(P)) \qquad \text{Equation 18}$$

In Equation 18, the maximum eigenvalue of the operator P is $$b_+(P) = \max_\rho tr[\rho P],$$

and the minimum eigenvalue of the operator P is $$b_-(P) = \min_\rho tr[\rho P].$$

When $\eta$ of Equation 18 is used, $|q(\vec{a}) - \eta|$ in Equation 17 is changed to $\delta(P)$, and $\delta(P) = (b_+(P) - b_-(P))/2$. Therefore, an upper bound of the error in Equation 17 may be given as in Equation 19.

$$err(\epsilon, q_c) \leq \frac{\epsilon \delta(P)}{(1-\epsilon)} \qquad \text{Equation 19}$$

In some embodiments, the measurement device may perform the optimization to minimize the upper bound of Equation 19 while constraining the operator P to a predetermined condition. In some embodiments, the predetermined condition may be $P \geq 0$. Referring to Equation 11, the measurement device may find the parameter $\epsilon$ and the operator P by, for example, performing the optimization of Equation 20.

$$\min\; \epsilon \delta(P) \qquad \text{Equation 20}$$
$$\text{subject to}$$
$$\tilde{\Pi}_{\vec{a}} - (1-\epsilon) V|\vec{a}\rangle\langle\vec{a}|V^\dagger \geq 0$$
$$V = V_1 \otimes V_2 \otimes \ldots \otimes V_n$$

The measurement device may mitigate the detection crosstalk based on the parameter $\epsilon$ and the operator P found through the optimization (e.g., Equation 20). In some embodiments, the measurement device may output the measurement outcome in which the detection crosstalk is mitigated through the process of Equation 16 based on the parameter $\epsilon$ and the operator P.

Currently, although the error rate for the single-qubit measurements in IBMQ and Rigetti with the mitigation protocol, through the cloud-based quantum computing services is in a level of 1-10%, the error rate for two-qubit measurements rate increases to 10-30%. However, according to the above-described embodiments, the error rate is about 10% on average. As such, according to an embodiment, the error rate due to the detection crosstalk can be maintained within 10%.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A quantum computing device comprising:
   a quantum device including a qubit system;
   a detector configured to perform measurements on a plurality of qubits of the qubit system; and
   a mitigation module configured to perform quantum pre-processing on the plurality of qubits before performing the measurements on the plurality of qubits in the detector, and perform classical post-processing on a measurement outcome of the plurality of qubits in the detector to mitigate a detection crosstalk included in the measurement outcome,
   wherein the mitigation module is configured to obtain a quantum measurement operator describing the detector through quantum detector tomography, and perform the quantum pre-processing and the classical post-processing through analysis of the quantum measurement operator.

2. The quantum computing device of claim 1, wherein the mitigation module is configured to perform the quantum pre-processing by applying a single-qubit gate to each of the plurality of qubits.

3. The quantum computing device of claim 2, wherein the single-qubit gate represents a local unitary.

4. The quantum computing device of claim 1, wherein the mitigation module is configured to perform the quantum pre-processing and the classical post-processing by performing decomposition on the quantum measurement operator based on a parameter and an operator to optimize the parameter and the operator.

5. The quantum computing device of claim 4, wherein the mitigation module is configured to normalize the quantum measurement operator and decompose the normalized quantum measurement operator as a following equation:

$$(1-\epsilon) V_{\vec{a}}^{-1} |\vec{a}\rangle \langle \vec{a}| V_{\vec{a}}^{-1\dagger} + \epsilon P, \text{ and}$$

wherein the $\epsilon$ denotes the parameter, the $V_{\vec{a}}$ denotes a transformation of the quantum pre-processing, the $\vec{a}$ denotes the measurement outcome of the plurality of qubits, and P denotes the operator that is determined by the $\epsilon$ and the $V_{\vec{a}}$.

6. The quantum computing device of claim 4, wherein the operator is an operator of unit trace.

7. The quantum computing device of claim 4, wherein the mitigation module is configured to mitigate the detection crosstalk included in the measurement outcome based on the parameter and the operator.

8. The quantum computing device of claim 7, wherein the mitigation module is configured to mitigate the detection crosstalk included in the measurement outcome as in a following equation:

$$\frac{1}{1-\epsilon}\left((tr\prod_{\vec{a}})^{-1} p_\epsilon(\vec{a}) - \epsilon\eta\right),$$

and wherein the $\epsilon$ denotes the parameter, the $\eta$ denotes a constant determined by the operator, the $\vec{a}$ denotes the measurement outcome of the plurality of qubits, the $\Pi_{\vec{a}}$ denotes an operator describing a quantum measurement of the detector, the tr denotes a trace function, and $p_\epsilon(\vec{a})$ denotes a probability of obtaining the $\vec{a}$.

9. The quantum computing device of claim 4, wherein the mitigation module is configured to minimize an upper bound of an error between a measurement outcome without the detection crosstalk and an outcome obtained by approximating the measurement outcome without the detection crosstalk on an assumption that an expected value of a Hermitian operator in the decomposition is a constant, and
   wherein the Hermitian operator is defined by a local unitary of the quantum pre-processing and the operator in the decomposition.

10. The quantum computing device of claim 9, wherein the mitigation module is configured to optimize the parameter and operator to minimize the upper bound of the error.

11. The quantum computing device of claim 10, wherein the upper bound of the error is defined based on the parameter, a maximum eigenvalue of the operator, and a minimum eigenvalue of the operator.

12. The quantum computing device of claim 11, wherein the mitigation module is configured to optimize the parameter and the operator while constraining the operator to a predetermined condition.

13. The quantum computing device of claim 12, wherein the predetermined condition is a condition in which the operator is equal to or greater than zero.

14. A quantum computing device comprising:
    a quantum device including a qubit system;
    a detector configured to perform measurements on a plurality of qubits of the qubit system;
    a plurality of single-qubit gates positioned in front of the detector, and configured to be applied to the plurality of qubits, respectively,
    a mitigation module configured to perform classical post-processing on a measurement outcome of the plurality of qubits,
    wherein the mitigation module is configured to obtain a quantum measurement operator describing the detector through quantum detector tomography, and perform the quantum pre-processing and the classical post-processing through analysis of the quantum measurement operator.

15. The quantum computing device of claim 14, wherein the mitigation module is configured to mitigate a detection crosstalk included in the measurement outcome by performing the classical post-processing.

16. The quantum computing device of claim 15, wherein the mitigation module is configured to decompose the quantum measurement operator based on a parameter and an operator, and optimize the parameter and the operator to mitigate the detection crosstalk.

17. A method of mitigating a detection crosstalk in a quantum computing device, the method comprising:
    performing quantum pre-processing on a plurality of qubits;
    performing measurements on the plurality of qubits on which the quantum pre-processing is performed; and
    performing classical post-processing on a measurement outcome of the plurality of qubits to mitigate a detection crosstalk included in the measurement outcome,
    wherein performing the classical post-processing includes obtaining a quantum measurement operator describing a detector that perform the measurements through quantum detector tomography, and performing the quantum pre-processing and the classical post-processing through analysis of the quantum measurement operator.

18. The method of claim 17, wherein performing the quantum pre-processing includes applying a single-qubit gate to each of the plurality of qubits.

19. The method of claim 17, wherein performing the classical post-processing includes decomposing, based on a parameter and an operator, the quantum measurement operator, and optimizing the parameter and the operator to mitigate the detection crosstalk.

* * * * *